(12) United States Patent
Pramanik et al.

(10) Patent No.: US 8,572,517 B2
(45) Date of Patent: Oct. 29, 2013

(54) SYSTEM AND METHOD FOR MODIFYING A DATA SET OF A PHOTOMASK

(75) Inventors: Dipankar Pramanik, Saratoga, CA (US); Michiel Victor Paul Kruger, Berkeley, CA (US); Roy V. Prasad, Los Gatos, CA (US); Abdurrahman Sezginer, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 609 days.

(21) Appl. No.: 12/136,277

(22) Filed: Jun. 10, 2008

(65) Prior Publication Data
US 2009/0307649 A1 Dec. 10, 2009

(51) Int. Cl.
*G06F 17/50* (2006.01)
(52) U.S. Cl.
USPC .............................................. 716/50; 716/53

(58) Field of Classification Search
USPC ...................................................... 716/50–54
See application file for complete search history.

(56) References Cited

U.S. PATENT DOCUMENTS

| | | | |
|---|---|---|---|
| 7,231,628 B2* | 6/2007 | Pack et al. | 716/52 |
| 7,237,221 B2* | 6/2007 | Granik et al. | 716/52 |
| 7,348,108 B2* | 3/2008 | Cote et al. | 430/5 |
| 7,703,049 B2* | 4/2010 | Abrams et al. | 716/50 |
| 7,921,383 B1* | 4/2011 | Wei | 716/54 |
| 2004/0005089 A1* | 1/2004 | Robles et al. | 382/141 |
| 2004/0133871 A1* | 7/2004 | Granik et al. | 716/19 |

* cited by examiner

*Primary Examiner* — Binh Tat
(74) *Attorney, Agent, or Firm* — Kenyon & Kenyon LLP

(57) ABSTRACT

The present invention provides a method for compensating infidelities of a process that transfers a pattern to a layer of an integrated circuit, by minimizing, with respect to a photomask pattern, a cost function that quantifies the deviation between designed and simulated values of circuit parameters of the pattern formed on a semiconductor wafer.

11 Claims, 8 Drawing Sheets

SYSTEM AND METHOD FOR MODIFYING A DATA SET OF A PHOTOMASK

TECHNICAL FIELD

The present invention relates to data preparation for lithography which is used in manufacturing integrated circuits. In particular, the invention relates to compensating distortions in the patterning process in order to achieve desired electrical parameters.

DESCRIPTION OF THE RELATED ART

Integrated circuits are manufactured by iterating operations of depositing a film of material on a wafer, and patterning the deposited layer. To pattern a film, the film is coated by a resist material. An image of the desired pattern is projected on the resist optically or by an electron beam. Exposed part of a positive resist chemically changes so that it becomes soluble in a developer solution. The resist thus forms a stencil on the film to be patterned. The pattern of the resist is transferred to the underlying film of material, typically by a plasma-etch process.

The proximity effect is well known in the art of lithography. The phenomenon affects electron beam and optical lithography processes. In electron beam lithography, the proximity effect is caused primarily by electron-scattering. An electron intended for an image point can be scattered, or create secondary electrons, exposing resist in a neighborhood of the intended image point. In optical lithography, the wave nature of light precludes a photon being directed to a pin-pointed location in the image plane. The photon is likely to expose the resist in a neighborhood of the intended image point. Another contributor to the proximity effect is diffusion of molecules that make up the latent image in the resist. Generally, the proximity effect becomes more pronounced as dimensions of features, or distances between features, become comparable to or smaller than the resolution of the imaging process. Hence the term "proximity effect." If not compensated, the proximity effect can alter critical dimensions (CD) of the pattern, or even the topology of the pattern.

In optical lithography, the dimension of a feature is expressed as $k_1 \lambda / NA$, where $\lambda$ is the exposure wavelength, NA is the numerical aperture of the projection system, and $k_1$ is a dimensionless factor. The smaller is the $k_1$ factor, the stronger is the proximity effect. The proximity effect becomes strong and maintaining sufficient yield becomes increasingly difficult as $k_1$ decreases below 0.35. Optical proximity correction (OPC) and resolution enhancement techniques (RET) are well-known methods to counter the proximity effect and to improve the fidelity of printed patterns. Optical proximity correction pre-distorts the pattern that is placed on the photo-mask (master copy) so that the patterns formed by lithography approximately match a target layout. The degree of matching is determined by geometric considerations. For example, edge-placement error is the distance between an edge of a target pattern and the corresponding edge of the actual pattern formed on a semiconductor wafer. One implementation of OPC minimizes sum of squares of edge placement errors measured at a multitude of points at the edges of a pattern.

At the time of this writing, the wavelength that is commercially used in lithography is $\lambda=193$ nm (ArF excimer laser), and the highest numerical aperture is NA=1.35. The densest line-space pattern printed by such a system, in a single-exposure, has a half-pitch of 40 nm, which amounts to $k_1=0.28$. The same wavelength and numerical aperture is planned to serve 32-nm and 22-nm nodes using double patterning. At such extreme low values of $k_1$, proximity effect is extreme. Significant geometric differences can remain between the target layout and printed pattern despite best efforts in RET and OPC.

BRIEF SUMMARY OF EMBODIMENTS OF THE INVENTION

According to various embodiments of the invention, systems and methods for compensating proximity effect are provided. The method includes: providing a target pattern and target value for an electrical parameter of the circuit; simulating a lithographic patterning process and predicting a pattern that will be printed; calculating the electrical parameter for the predicted pattern; calculating a score that indicates how well the calculated electrical parameter matches its target value; and adjusting a data set that is used to manufacture a photomask in a way that improves the score.

In one embodiment, the method further performs: representing the photomask data as a set of polygons; segmenting an edge of a polygon; altering the polygon by moving a segment of its edge based on the calculated electrical parameter. In one embodiment, the electrical parameter comprises one or more parameters from the group consisting of saturation current, leakage current, threshold voltage, gain, resistance, capacitance, and inductance. In one embodiment, the score is a demerit function that indicates how far the calculated electrical parameter deviates from its target value; and adjusting the data set comprises minimizing the demerit function.

In yet another embodiment, the demerit function is calculated using geometric variables derived from comparing the predicted circuit pattern with a target circuit pattern.

In still another embodiment, the distribution and polarization variables of illumination incident on a photomask are optimized to minimize a demerit function.

In yet another embodiment, demerit function is calculated using more than one process condition of a lithography process used to create the circuit pattern from the photomask.

In one embodiment, the demerit function comprises a plurality of demerit functions, a first demerit function is based on a differential of a first simulated electrical parameter of a device of the circuit pattern and a desired electrical parameter of the device.

In yet still another embodiment, the demerit function further comprises a second demerit function, the second demerit function is based on a differential of the first simulated electrical parameter and a maximum allowable electrical parameter of the device.

In still another embodiment, the demerit function further comprises a second demerit function, the second demerit function is based on a differential of a minimum allowable electrical parameter of the device and the first simulated electrical parameter.

In yet another embodiment, the demerit function further comprises a second demerit function; the second demerit function is based on a differential of the first simulated electrical parameter and a second simulated electrical parameter of a second device in the circuit pattern, wherein the first and second simulated electrical parameters are of a same type of parameter.

In still another embodiment, the demerit function comprises a plurality of demerit functions, a first demerit function is based on a differential of a first simulated process condition and a second simulated process condition, wherein the first and second simulated process conditions are of a same type of conditions.

In accordance with an embodiment of the present invention, a method for compensating a proximity effect is provided. The method comprises: creating a circuit pattern using a lithography process with a photomask defined by a data set having a plurality of polygons that define patterns on the photomask; calculating a cost function using a process parameter of the lithography process or an electrical parameter of the created circuit pattern; and adjusting the polygons based on results of the calculated cost function. In one embodiment, the polygons are adjusted to minimize the value of the cost function.

In one embodiment, the cost function comprises a first term defined by a sum of squares of normalized differences between simulated and designed values of electrical parameters for a multitude of circuit components.

In another embodiment, the cost function further comprises a second term being defined by an amount by which the simulated value of an electrical parameter exceeds a maximum permissible value for the electrical parameter.

In yet another embodiment, the cost function further comprises a third term defined by an amount by which the simulated value of an electrical parameter falls below a minimum allowable value for the electrical parameter.

In still another embodiment, the cost function further comprises a fourth term defined by the difference of values of a first and a second electrical parameter of a simulated wafer pattern.

In still another embodiment, the cost function further comprises a fourth equation defined by a change in the value of a circuit parameter in response to a change in the condition of a patterning process.

In still another embodiment, the cost function further comprises at least one term that restricts the simulated value of an electrical parameter as being not larger than a maximum allowable value or not smaller than a minimum allowable value.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

It should be understood that the invention can be practiced with modification and alteration, and that the invention be limited only by the claims and the equivalents thereof.

DETAILED DESCRIPTION OF THE EMBODIMENTS OF THE INVENTION

Before describing the invention in detail, it is useful to describe an example environment in which the invention may be implemented. In one embodiment, the invention can be implemented using a software application such as, for example, a layout optimization tool running on a computer or computing system. The computer or computing system might be a personal computer, workstation, minicomputer, mainframe, etc. The computer might include various input devices, such as a keyboard, mouse, trackball, etc.; various output devices, such as a monitor, printer, etc.; various communication ports such as network connections, USB ports, serial and parallel I/O ports, etc.; and various storage devices, such as ROM, RAM, disk drives, magnetic disks, magnetic tape drives, etc.

Monitors and printing devices can be used to provide a visual display of the design as well as other ancillary information to aid the developer in the design process, including various GUIs, graphical representations and other information. Storage devices, whether networked or local, can be used to store data and other information including design tools, design kit information, libraries and so on.

Figure 1A:
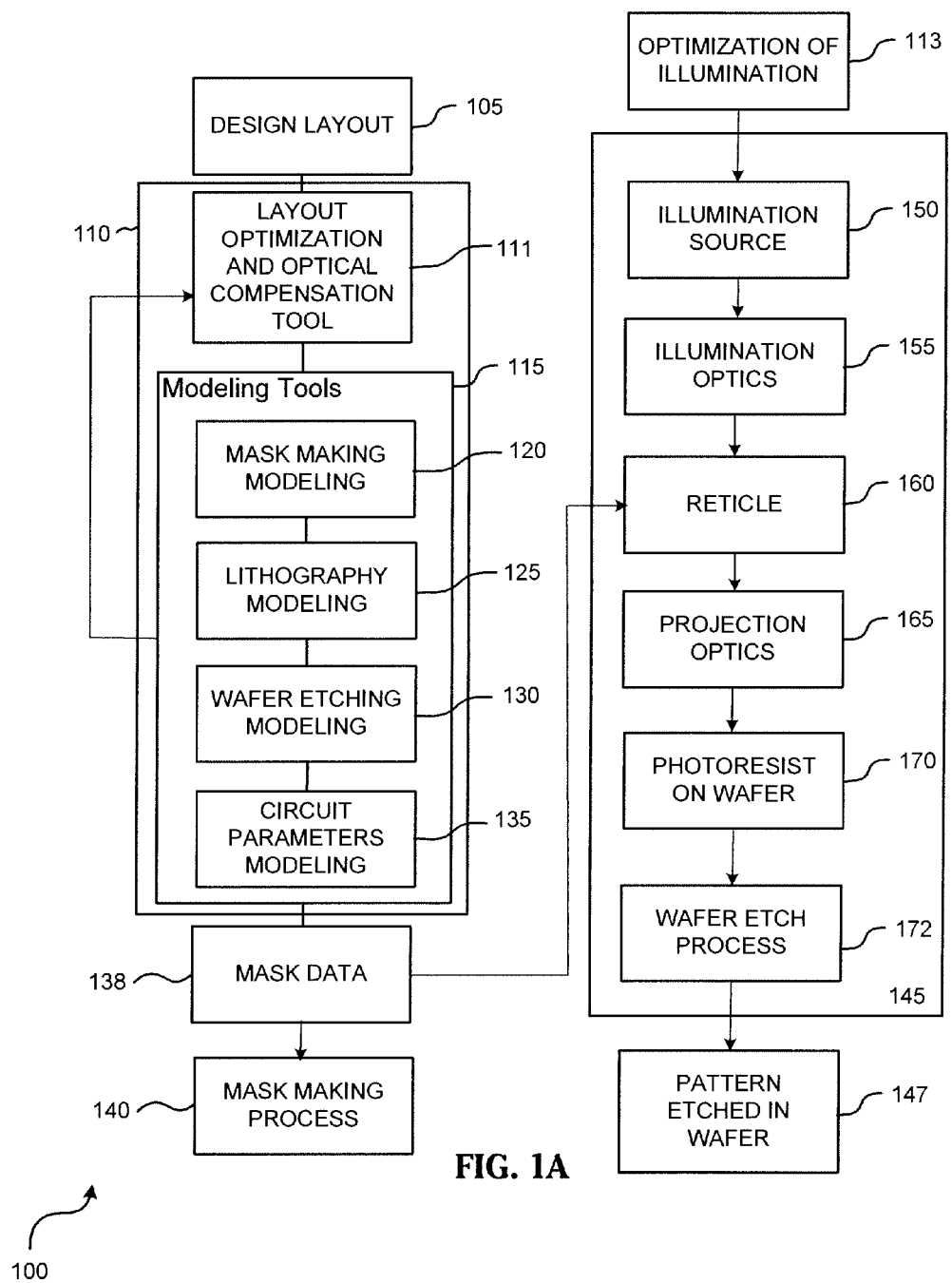
FIG. 1A illustrates an example environment in which the layout optimization and optical compensation tool of the invention is being implemented according to an embodiment of the present invention.

FIG. 1A is a diagram illustrating an example environment 100 in which the design, modeling, optimization, and the production of a wafer takes place in accordance with one embodiment of the invention. Referring now to FIG. 1, the illustrated example environment 100 includes a design layout process 105, a layout optimization process 110, a modeling process 115, a photomask (mask for short) production process 140, and a wafer patterning process 145. In one embodiment, layout optimization process 100 includes the application of optical proximity compensation and process proximity compensation techniques to optimize the layout such that the final circuit patterns on the wafer are rendered to have the geometric shapes and circuit parameters as close as possible to their design shapes and values.

Generally, the production of circuits on a wafer starts with the layout 105. In one embodiment, a layout is a dataset that comprises a plurality of polygons. The union of these polygons generally define the shapes and features of circuit patterns to be etched in the wafer. We call layout 105 the target pattern, interchangeably. In one embodiment, the target pattern is designed using desired electrical parameters of a circuit design as conditions for selecting the size, shape, type of polygons. The electrical parameters and timing analysis may also dictate how circuits are placed and interconnections are routed within an integrated circuit.

Once the target pattern is completed, a photomask 140, which is a physical master copy of the pattern, is produced. The pattern on the photomask is repeatedly transferred on to semiconductor wafers by a lithography process 145 to produce many integrated circuits. Methods and apparatus for manufacturing photomasks are known to those skilled in the art. The pattern is usually written on the photomask by a scanning laser or electron beam system that is capable of exposing a radiation sensitive resist on the photomask. The image written on the resist is developed, and the pattern of the resist is transferred to a film deposited on a mask blank. The mask blank is usually made of fused silica. The mask pattern is formed on a molybdenum-silicon (MoSi), chrome, chrome-oxide, or tantalum-nitride film deposited on fused silica. In chromeless phase shift masks and alternating phase-shift masks, a portion of the pattern is etched into the fused silica mask blank. In extreme ultraviolet (EUV) lithography, the mask is reflective. The mask blank is coated with alternating layers of two materials of distinct refractive index, such as molybdenum and silicon, to form a film-stack that is highly reflective at EUV wavelength (about 13.5 nm). The mask pattern is etched into an absorber film deposited on top of the reflective film stack. In some embodiments, lithography is performed without any physical mask. Examples of this are electron-beam-direct-write lithography and optical maskless lithography. In direct-write lithography, one or many beams are focused on the wafer and switched on and off as the beam(s) are scanned. The mask pattern in this case is not captured in a physical master copy, but in a dataset that is used to scan and switch the beam(s). In optical maskless lithography, the mask pattern is dynamically formed in a spatial modulator, which comprises an array of micro mirrors or other light modulators. This invention is equally applicable to embodiments that use a physical mask, an array of light modulators, or direct write systems. The term mask pattern will be understood to be the data set that modulates the exposure of the wafer. It shall not be considered limiting the invention to embodiments that use a physical photomask.

The mask pattern is not a scaled replica of the target pattern 105. The reason for this is that the patterning process 145 distorts patterns. Process proximity compensation (PPC) 110 is a computational tool that optimizes mask data 138 such that the pattern 147 etched in the wafer is as close as possible to the design intent. In other words, process proximity compensation 110 compensates for the distortions of the patterning process 145.

An essential element of the compensation tool 110 is a computation model 115 of the patterning process. The computational model 115 comprises one or more of: a model 120 of the mask making process, a model 125 of the lithography process, a model 130 of the wafer etching process. Tools used for mask modeling, lithography modeling, and wafer etching modeling are well known to those skilled in the art of lithography. In addition to these modules, the computational model 115 comprises model 135 of one or more parameters of the circuit that is formed by the patterning process. Examples of such parameters are resistance, capacitance, inductance, transistor gain, leakage current, and saturation current.

As mentioned, layout optimization process 110 uses optical proximity compensation and process proximity compensation methods to modify the layout such that the topology of the final wafer circuit is the same as that of the target pattern; and that circuit parameters of the final wafer circuit are as close as possible to their designed values. In one embodiment, this is done by minimizing a cost function that includes one or more electrical parameters of the circuit. Preferably, the electrical parameters to include in the cost function include the same electrical parameters used in the design of the initial data set. Electrical parameters of the simulated wafer pattern are simulated using circuit parameters modeling tool 135. In contrast, conventional optical proximity compensation and process proximity compensation methods only consider geometric variables deduced from comparing a simulated wafer geometry with a target pattern geometry. In one embodiment, a non-linear optimization function such as, for example, the Levenberg-Marquardt algorithm is used to minimize the cost function. The layout optimization and modeling processes are iterative processes and may need to be repeated multiple times before a desired result is reached. Cost function and demerit function are used interchangeably. Minimizing a demerit or cost function f(x) is equivalent to maximizing a merit or objective function such as −f(x). Therefore, the terms demerit function, cost function, merit function, and objective function have equivalent purposes.

Once the optimization process is completed and a desired layout is produced, a photomask 140 can be created. Once photomask 140 is created, it can then be used to pattern wafer 170. In the case of optical projection lithography, this patterning process starts at an illumination source 150, which provides a light source to an illumination optics 155. Illumination source 150 can be, for example, a deep ultra-violet (DUV) light source or an extreme ultra-violet (EUV) light source. An example UV light source that can be used in illumination optics 150 is an ArF excimer laser of 193 nm wavelength.

Illumination optics 155 can be used to condition the light coming from illumination source 150. For example, illumination optics 155 may include a partial coherence adjuster to vary the angular distribution of electromagnetic radiation onto photomask or reticle 160. The illumination optics 155 may include components to render the illumination polarized or unpolarized. The polarization state and the distribution of illumination among directions of incidence affects the quality of the projected image in a way that depends on the pattern.

Once the light leaves photomask 160, it enters projection optics 165, which projects the pattern on to a photoresist film 170 that is coated on the wafer. Projection optics 165 is usually designed to scale down the pattern, typically by a factor of 4, but otherwise to form the image with least amount of distortion and aberrations. After the photoresist is exposed, it is subject to post-exposure-bake followed by a wet developing process. This forms a resist pattern on the wafer. The resist pattern is transferred to a layer of the wafer by typically a plasma-etch process 172, which can further distort the pattern and alter its critical dimensions.

Although an optical projection lithography process has been discussed, one skilled in the art understands that the layout optimization tool or optical compensation tool 110 can also be implemented with other lithography techniques such as, for example, electron projection lithography, electron-beam direct-write, EUV direct-write lithography.

Figure 1B:
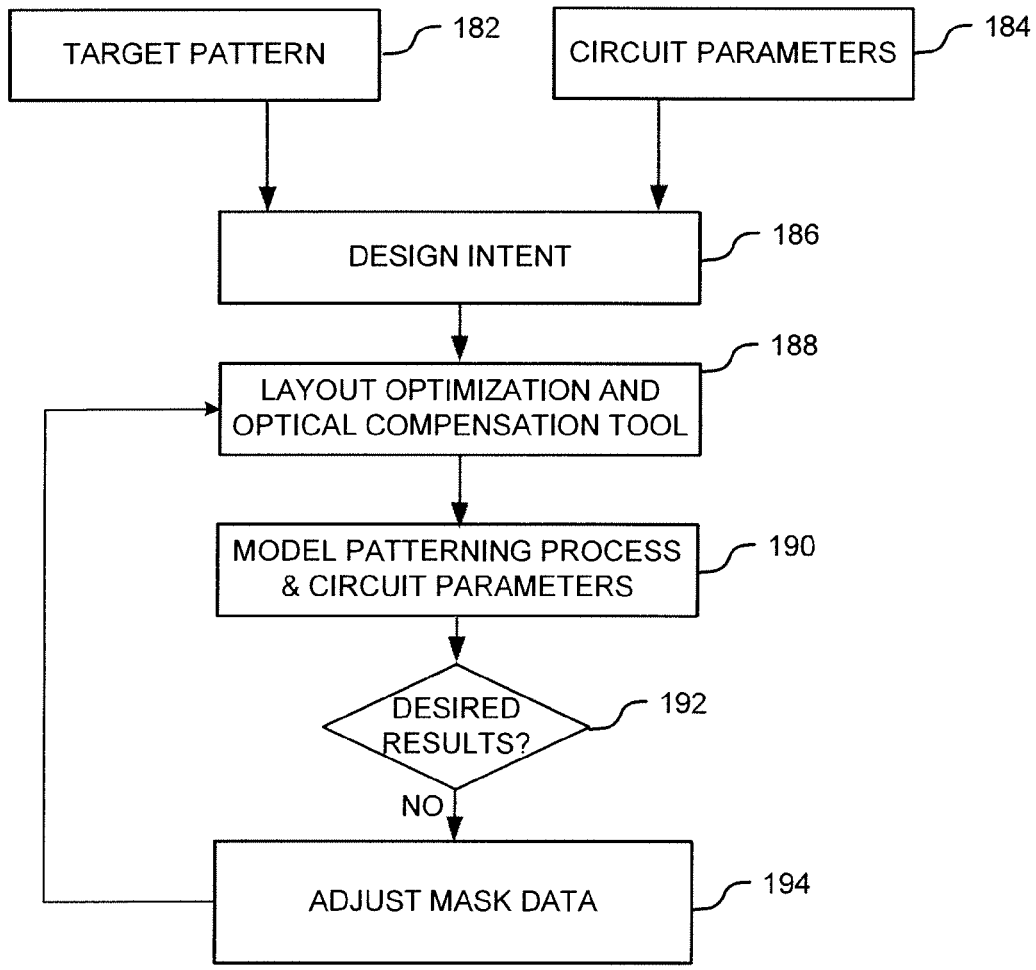
FIG. 1B illustrates an example high-level flow of the circuit designing, modeling, and optimization process according to an embodiment of the present invention.

FIG. 1B illustrates a high-level flow diagram of the circuit design, modeling, and optimization process according to an embodiment of the present invention. Referring now to FIG. 1B, to produce an initial data set that defines patterns on a photomask, a set of polygons data 182 are received from circuit designers. The union of the polygons 182 is the target pattern. Target pattern defines the pattern to be etched into a layer of the wafer. Polygons data 182 can then be combined with specified circuit parameters 184 to produce a design intent 186. Circuit parameters 184 can be electrical parameters such as, for example, resistance, capacitance, leakage current, saturation current, gain, and inductance. These parameters are usually specified by circuit designers. In an operation 188, the mask pattern is generated using optical proximity compensation OPC, or in more general, process proximity compensation PPC techniques using circuit parameters 184 in addition to the target pattern 182.

In an operation 190, how the mask pattern would be transferred to a layer in the wafer is modeled. Operation 190 comprises any combination of computational models of mask making, lithography and wafer-etch processes. In addition, operation 190 comprises a method that models electrical parameters of the circuit that would be etched into the wafer.

If the desired circuit topology and electrical parameters are reached in operation 192, then the synthesis of the mask data is completed. Otherwise, the data set is adjusted in operation 194 in a way that the circuit parameters of the simulated wafer pattern approach their design values, and the process repeats operations 188-194.

In an embodiment, a cost or demerit function quantifies how close the predicted wafer pattern is to the design goals for circuit topology and circuit parameters. The mask pattern is parameterized in terms of polygon dimensions or edge positions. The cost function is optimized with respect to geometric parameters of the mask pattern. Operation 194 may adjust the mask pattern using one of many well known optimization algorithms. For example, Gauss-Newton, Newton, quasi-Newton, Levenberg-Marquardt, simplex, simulated annealing, or evolutionary (genetic) algorithms can be used to determine the operation in the search space of geometric parameters of the mask pattern, which is how the mask pattern is changed in operation 194.

Figure 2:
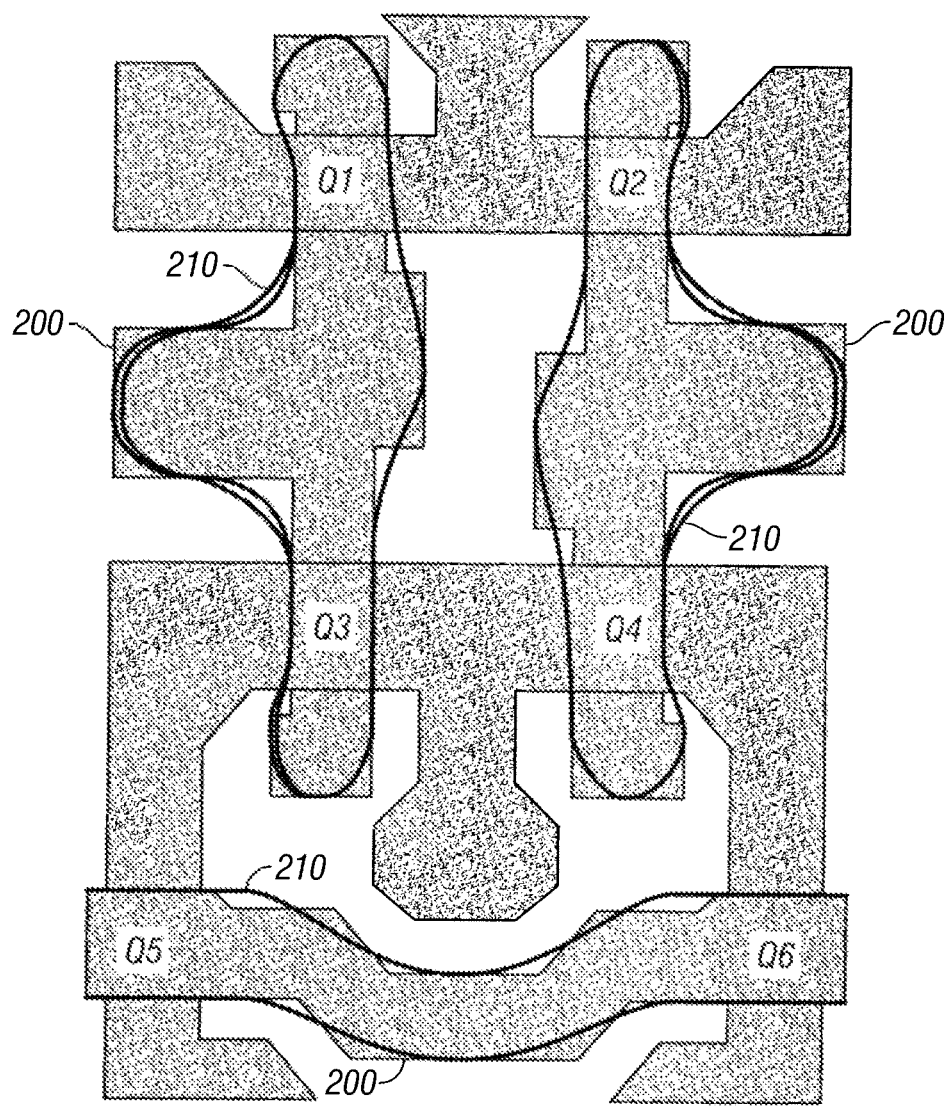
FIG. 2 illustrates an example of a simulated wafer pattern layered on top of an as intended (target) design pattern.

FIG. 2 illustrates an example circuit pattern produced using a lithography process described in FIG. 1. Referring now to FIG. 2, pattern 200 is the target circuit pattern from an original data set. In an ideal situation, the final wafer circuit pattern would match the target pattern 200 perfectly. This is, however, not possible in practice due to the physics of optics such as, for example, light diffraction. As shown in FIG. 2, circuit patterns 210 represent simulated wafer patterns. Circuit patterns 210 closely follow designed patterns 200. As can be observed, circuit patterns 210 deviate more from designed patterns 200 at vertices of polygons 200. A corner is inherently hard to image because all imaging modalities have finite resolution, i.e., they blur the image. The radius of curvature of a pattern formed on the wafer cannot be much smaller than the image resolution.

Figure 3A:
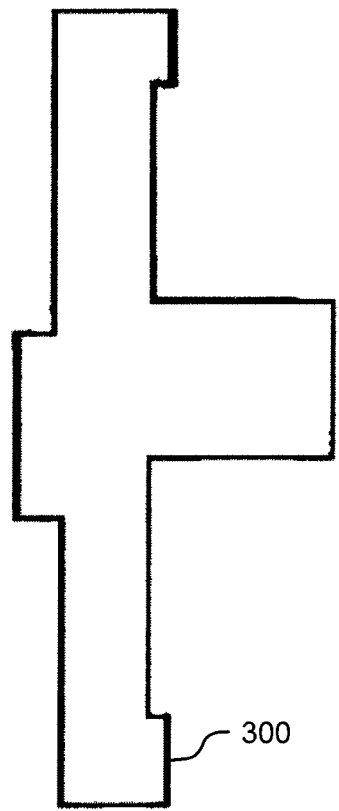
FIG. 3A illustrates an example of a polygon in the intended (target) design pattern.

FIG. 3A is a diagram illustrating a typical polygon 300 in the target pattern. In one embodiment, the mask pattern initially comprises polygons 300 of the target pattern and possibly additional polygons that are sub-resolution assist features. In an embodiment, edges of polygons in the mask pattern are divided into a plurality of segments. Moving the segments is a method of adjusting or changing the mask pattern. The purpose of segmenting the edges is to increase the degrees of freedom by which the mask pattern can be changed. As will be discussed in detail below, a non-linear optimization method will be used to adjust the edge segments of the mask pattern.

Figure 3B:
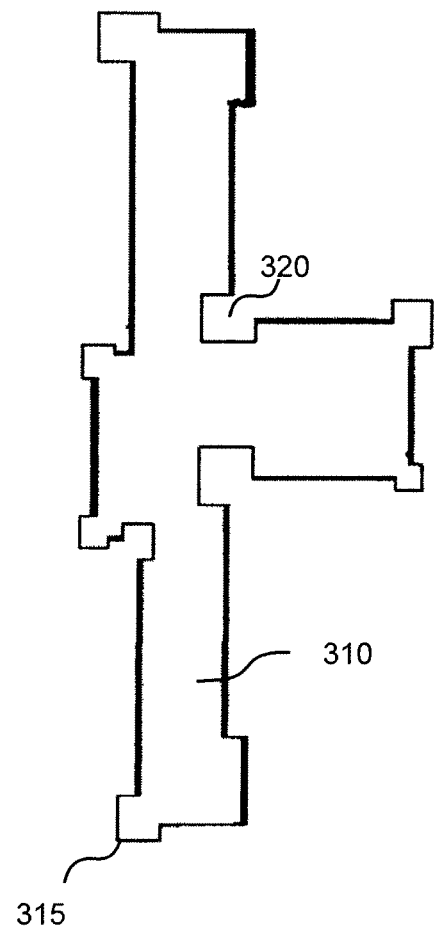
FIG. 3B illustrates an example of how the polygon in FIG. 3A may be modified by the optical compensation tool according to an embodiment of the present invention.

FIG. 3B is a diagram illustrating an example of a modified polygon 310 in the mask pattern according to an embodiment of the present invention. Referring now to FIG. 3B, modified circuit pattern 310 includes modified segments 315 and 320. In one embodiment, modified circuit pattern 310 is created using a modified data set, which is produced by optical proximity correction (OPC) or process and proximity compensation (PPC) tool 110. Referring to FIGS. 2 and 3B, circuit pattern 310 is modified by segment 315 because the corner is missing from the imaged pattern 210. Thus, to compensate for the missing corner, in one embodiment, optical compensation tool 110 adjusts one or more segments of the contour in the data set such that the next simulated wafer pattern is closer to the intended design pattern 200. In the above example, optical compensation tool 110 compensates for the missing corner by expanding the contour at segment 315. Where there are extra and unwanted patterns, optical compensation tool 110 reduces the size and shape of the contour as shown in segment 320. This pre-distortion technique is also known as optical proximity compensation (OPC) and process proximity compensation (PPC).

In one embodiment, the process compensation tool 110 minimizes the cost function by making arbitrary changes to the mask pattern. In an embodiment, the mask pattern is pixelized and pixels are assigned a mask film stack. For example, each pixel can have either no film covering the fused-silica mask blank, or an opaque film covering the mask blank. The opaque film can be made of, for example, molybdenum-silicon, chrome, chrome-oxide, or tantalum-nitride. The covering of the pixels are selected in a binary manner in a way to minimize the cost function, which depends on simulated values of circuit parameters of the wafer pattern. In another embodiment, the mask pattern can be determined by minimizing the cost function with respect to the first-order diffraction coefficients of the mask pattern, or equivalently, with respect to coefficients of the 2-dimensional spatial-Fourier transform of the mask transmission function. Yet in another embodiment, the mask pattern is determined by minimizing the cost function with respect to a scalar function, wherein the edges of the mask pattern are level curves of the scalar function. These methods are usually referred to as inverse lithography in the prior art. In the prior art, the cost function depends on geometric properties of the simulated wafer pattern. The distinction of the present invention from the prior art is that the cost function that is minimized depends not only on geometric properties of the simulated wafer pattern, but also on differences between simulated circuit parameters of the wafer pattern and the design values of the circuit parameters.

As mentioned, in one embodiment, process compensation tool 110 is configured to use a non-linear optimization method to derive the mask pattern. The non-linear optimization method can be, for example, the Levenberg-Marquardt algorithm, Gauss-Newton algorithm, Quasi-Newton algorithm, simplex-descent method, simulated annealing, genetic algorithm, random search, and grid search. In one embodiment, optical compensation tool 110 is configured to use the Levenberg-Marquardt algorithm as the minimization function. The optimization algorithm minimizes a cost function or equivalently maximizes an objective function. The cost function can include geometric differences between target pattern 200 and simulated wafer pattern 210 at one or more conditions of the patterning process. The cost function can also include simulated electrical parameters of a simulated wafer pattern at one or more conditions of the patterning process. The patterning process has many variables such as exposure dose, focus of the optical imaging system, temperature history during the post-exposure-bake, which are tightly controlled, but nevertheless have non-zero variances. There are similar process parameters in etch processes such as, pressures, flow-rates, RF-power, drive voltage. Likewise, there are process variations in the mask making process that cause variations in the dimensions of the patterns written on the mask. Process variations cause variations in the circuit formed on the wafer. One of the goals of the optimization method 110 that generates the mask data is to minimize the variations in the electrical parameters of the circuit formed on the wafer.

Figure 4:
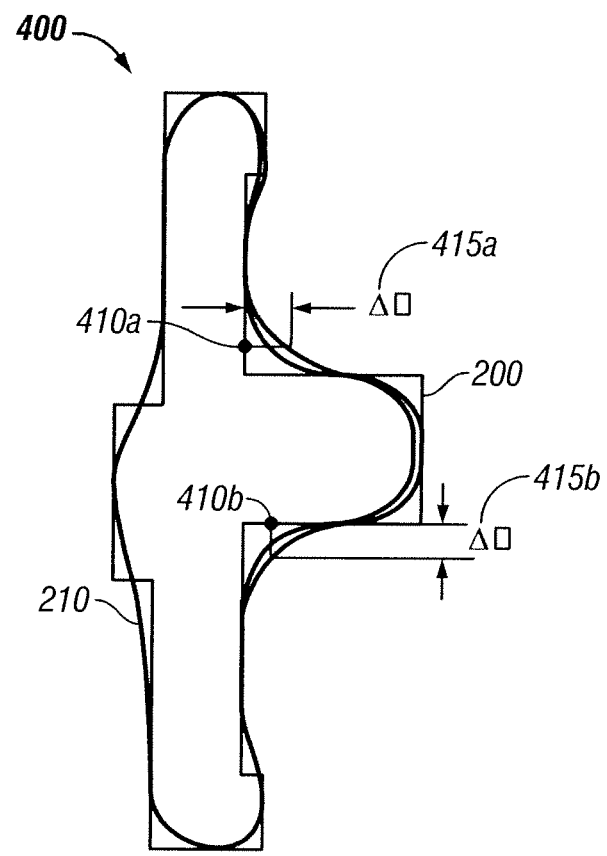
FIG. 4 illustrates an example of an optical compensation method using geometric variables according to an embodiment of the present invention.

FIG. 4 is a diagram illustrating an example of geometric differences between target pattern 200 and simulated wafer pattern 210. Referring now to FIG. 4, a circuit pattern 400 includes target points 410a-b placed on the edges of the polygons in the target pattern, and edge-placement errors (EPE) 415a-b. Preferably, target points are placed at critical features of the target pattern 200. Target points density can also be increased in areas of interest. FIG. 4 shows only two target points for simplicity. In practice many more target points would be placed on polygon 200.

As shown in FIG. 4, edge-placement error 415a is the difference between the location of target point 410a of target pattern 200 and the location of the edge on the simulated wafer pattern 210. As described, edge-placement error 415a and 415b are measures of geometric differences between target pattern 200 and simulated wafer pattern 210. In one embodiment, the cost function includes a term that consists of sum of squares of a multitude of such edge-placement errors. Minimizing the cost function determines how segments (e.g. segments 315 and 320) are to be adjusted in the mask pattern. Additionally, a tolerance value and a maximum allowable value for edge-placement error 415a can also be included in optimization 110.

Figure 5:
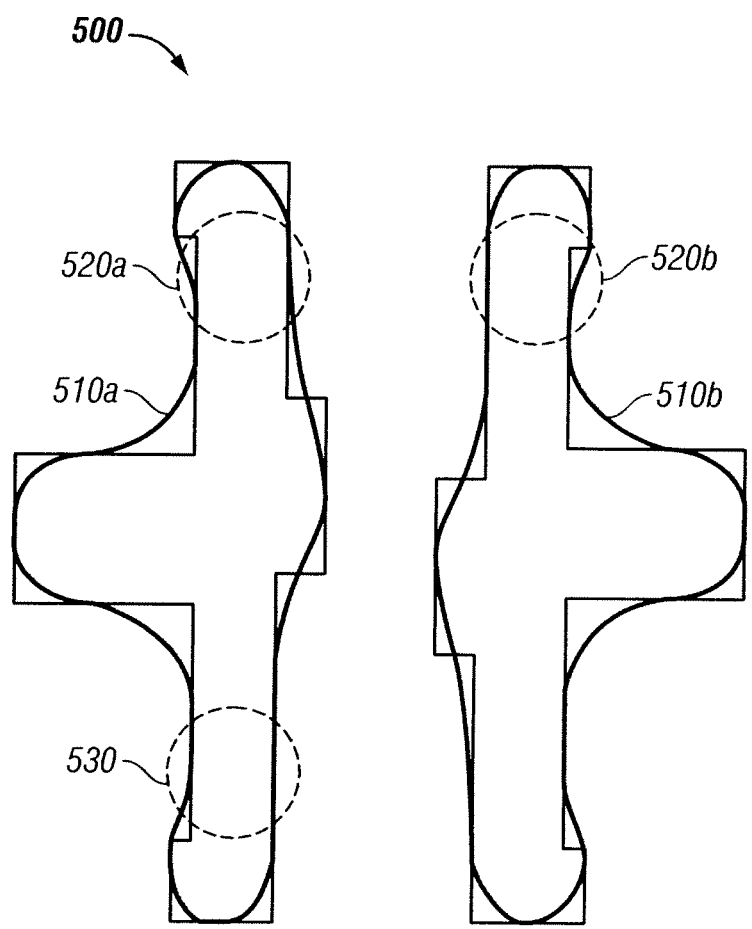
FIG. 5 illustrates an example of an optical compensation method using simulated electrical parameters of an imaged circuit feature according to an embodiment of the present invention.

FIG. 5 is a diagram illustrating an example of using non-geometric variables such as, for example, simulated electrical parameters of the simulated wafer pattern as input variables for the minimization function according to one embodiment of the invention. Referring now to FIG. 5, circuit pattern 500 comprises simulated wafer patterns 510a and 510b. For ease of illustration, assume patterns 510a and 510b are patterns of two transistor pairs. Transistor pair 510a includes gate regions 520a and 530. Similarly, transistor 510b includes a gate region 520b and a gate region 540.

In one embodiment, the non-linear minimization function is minimization of a cost or demerit function. The cost function can include geometric variables derived from comparing simulated wafer pattern 210 with target circuit pattern 200. Additionally, the cost function can include simulated electrical parameters of simulated wafer pattern 210. In one embodiment, the simulated electrical parameters comprise one or more parameters such as, for example, saturation current, leakage current, threshold voltage, gain, resistance, capacitance, and inductance. In one embodiment, the cost function can also include process conditions of the lithography process used to create photomask 160 and wafer 180. Additionally, process variables may include light distribution variable, polarization, intensity, focus, numerical aperture, zoom, and apodization of a projection lens, etc. Methods for deriving simulated values for electrical parameters of an imaged circuit feature are well known. For example, see 1) Sponton, et al., "A full 3D TCAD simulation study of linewidth roughness effects in 65 nm Technology," IEEE SISPAD 2006, p. 377-380, 2006; 2) Poppe et al. "From ploy line to transistor: building BSIM models for non-rectangular transistors," Proc. SPIE Vol. 6156, p. 61560P-1, SPIE, Bellingham, Wash., 2006; and 3) Poppe et al., "Platform for collaborative DFM," Proc. SPIE Vol. 6156, p. 61560E-1, SPIE, Bellingham, Wash., 2006. Each of these references is incorporated herein by reference in its entirety.

Referring to FIG. 5, in one embodiment, the overall cost function comprises a cost function that takes the differential of a simulated electrical parameter of simulated wafer pattern (e.g., imaged pattern 510a) and a desired electrical parameter of target circuit pattern 550 as a variable. This cost function can be represented by the expression $$\sum_{j=1} \left( \frac{P_j(\text{simulated}) - P_j(\text{design intent})}{\text{Tolerance}_j} \right)^2 \quad \text{(Eqn. 1)}$$

In the above equation, herein referred to as Eqn. 1, $P_j$(simulated) is a simulated value of a specific electrical parameter of a specific part of the circuit. The index j labels the electrical parameters that are considered. For example, $P_j$ can be the source-drain leakage current of the transistor controlled by gate 530. Pj(design intent) is a designed value of the $j^{th}$ electrical parameter, and $\text{Tolerance}_j$ is a tolerance value of the $j^{th}$ electrical parameter. The target and tolerance values are usually specified by circuit designers. In one embodiment, the cost function comprises a sum of squares of normalized differences $$\left( \frac{P_j(\text{simulated}) - P_j(\text{design intent})}{\text{Tolerance}_j} \right)$$

between simulated and designed values of electrical parameters for a multitude of circuit components.

Minimizing the value of cost function in Eqn. 1 with respect to adjustable geometric parameters of the mask pattern, produces a final wafer pattern which has circuit parameters close to their intended target values.

In one embodiment, the overall cost function includes a term that is related to the amount by which the simulated value of an electrical parameter (e.g., leakage current) exceeds a maximum permissible value for that parameter. This part of the cost function can be represented by the expression $$\sum_{j=1} \max\left(0, \frac{P_j(\text{simulated}) - P_j(\text{max allowed})}{\text{Tolerance}_j}\right)^2 \quad \text{(Eqn. 2)}$$

In the above equation, herein referred to as Eqn. 2, $P_j$(max allowed) is the maximum allowable value of the $j^{th}$ electrical parameter. Minimizing a cost function comprising the term of Eqn. 2 produces a mask pattern such that electrical parameters of the final wafer circuit pattern does not significantly exceed their predefined upper bounds.

In one embodiment, the overall cost function includes a term that is related to the amount by which the simulated value of an electrical parameter falls below a minimum allowable value for that electrical parameter. This part of the cost function can be represented by the expression $$\sum_{j=1} \max\left(0, \frac{P_j(\text{min allowed}) - P_j(\text{simulated})}{\text{Tolerance}_j}\right)^2 \quad \text{(Eqn. 3)}$$

In the above equation, herein referred to as Eqn. 3, $P_j$(min allowed) is the minimum allowable value for the electrical parameter. Minimizing a cost function comprising the term of Eqn. 3 produces a mask pattern such that electrical parameters of the final wafer circuit pattern do not significantly fall below their predefined lower bounds.

In one embodiment, the overall cost function can include a term related to the difference of values of a first and a second electrical parameter of the simulated wafer pattern. The first and second simulated electrical parameters should preferably be of the same type of electrical parameter, belonging to two circuit components that are designed to be matched. For example, an analog differential amplifier performs best when its transistors in a differential-pair are well matched. This term of the cost function can be represented with the expression $$\sum \sum_{i \neq j} \left( \frac{P_i(\text{simulated}) - P_j(\text{simulated})}{\text{Tolerance}_{ij}} \right)^2 \quad (\text{Eqn. 4})$$

In the above equation, herein referred to as Eqn. 4, $P_i$(simulated) is a simulated value of an $i^{th}$ electrical parameter. Tolerance$_{ij}$ is a tolerance for the difference between parameters $P_i$(simulated) and $P_j$(simulated), wherein indices i and j label two similar and nominally matched circuit parameters.

In one embodiment, optical compensation tool 110 can be configured to use Eqn. 4 to match two different features of the circuit. For example, transistors 510a and 510b are assumed to be a transistor pair. Thus, it is preferably that the electrical parameters at gate regions 520a and 520b, for example, match with each other. For example, it is preferable to have gate regions 520a-b have matching leakage current. Including the term of Eqn. 4 in the overall cost function, and minimizing the cost function with respect to the adjustable geometric parameters of the mask pattern in the optical compensation tool 110 can modify a mask data set such that circuit components matched by design are rendered matched in the wafer pattern.

In one embodiment, the overall cost function can include a term that is related to the change in the value of a circuit parameter in response to a change in the condition of the patterning process. The patterning process conditions include alignment, exposure dose, and focus of the lithography projector, temperature history of the post-exposure bake, mean-to-target error in the mask dimensions. This term of the cost function can be represented by the expression $$\sum_{j=1} \left( \frac{P_j(\text{simulated, process condition}_1) - }{P_j(\text{simulated, process condition}_2)} \right)^2 \quad (\text{Eqn. 5})$$

In the above equation, herein referred to as Eqn. 5, $P_j$(simulated, process condition$_1$) is a simulated value of a $j^{th}$ circuit parameter for a first condition of the patterning process. $P_j$(simulated, process conditions) is the simulated value the same parameter for a second condition of the patterning process. For example, the lithography projector could be at its best focus in the first condition, and 50 nm out of focus in the second condition. In one embodiment, optical compensation tool 110 can be configured to use Eqn. 5 to reduce variations in circuit parameters in response to variations in process conditions. Minimizing a cost function comprising the term in Eqn. 5 with respect to adjustable geometric parameters of the mask pattern yields a mask data set such that the variations in circuit parameters of the final wafer circuit patterns in response to variations in process parameters is substantially minimized.

In one embodiment, the overall cost function can include a term that can be represented by the expression $$-\sum_{j=1} \log\left(1 - \frac{P_j(\text{simulated})}{P_j(\text{max allowed})}\right) \quad (\text{Eqn. 6})$$

In the above equation, herein referred to as Eqn. 6, $P_j$(max allowed) is a maximum allowable value of the $j^{th}$ electrical parameter. In one embodiment, optical compensation tool 110 replaces equation 2 with equation 6. In equation 6, the simulated electrical or process parameter is not allowed to be larger than the maximum allowable value. In contrast, equation 2 allows the simulated electrical parameter to be larger than the maximum allowable value, but with a penalty.

In one embodiment, the overall cost function can include a term that can be represented by the expression $$-\sum_{j=1} \log\left(\frac{P_j(\text{simulated})}{P_j(\text{min allowed})} - 1\right) \quad (\text{Eqn. 7})$$

In the above equation, herein referred to as Eqn. 7, wherein $P_j$(min allowed) is a minimum allowable value of the $j^{th}$ electrical parameter. In one embodiment, optical compensation tool 110 replaces equation 3 with equation 7. In equation 7, the simulated electrical or process parameter is not allowed to be smaller than the minimum allowable value. In contrast, equation 3 allows the simulated electrical parameter to be smaller than the minimum allowable value, but with a penalty.

In one embodiment, the overall cost function can include one or more of cost function equations 1 through 5 or one or more of cost function equations 1 and 4-7. As these examples serve to illustrate a variety of functions might be provided to arrive at a desired cost function model.

Figure 6:
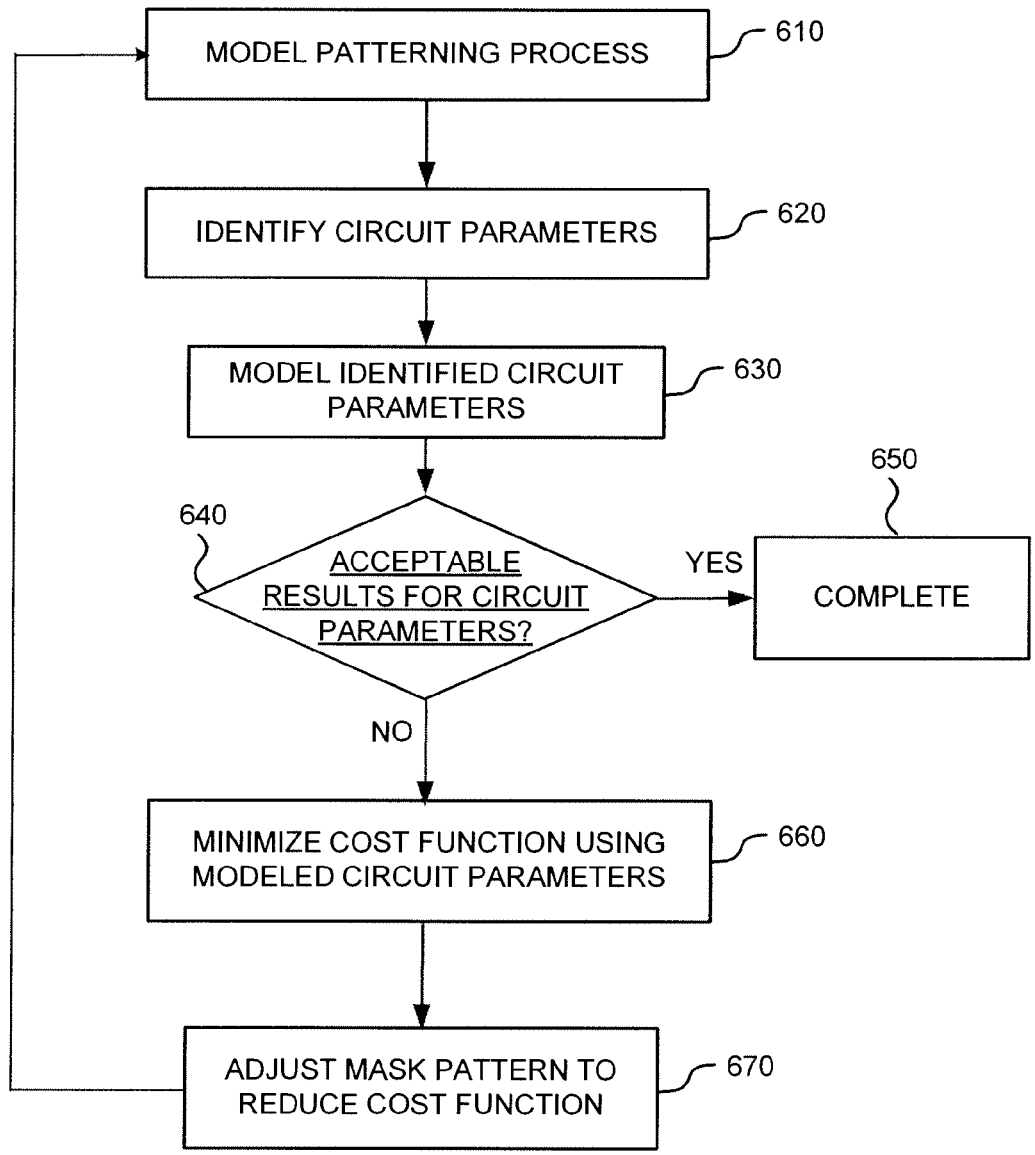
FIG. 6 illustrates a block diagram of a process flow implemented by the optical compensation tool according to an embodiment of the present invention.

FIG. 6 is a diagram illustrating a process flow 600 that can be implemented by optical compensation tool 110 according to one embodiment of the invention. Referring now to FIG. 6, in an operation 610, a target pattern is created in the design layout process in the form of a data set. As mentioned, the data set is defined by a plurality of polygons. An initial mask pattern is generated. For example, the initial mask data set can be similar to the target pattern for chrome on glass or for attenuated-phase-shift masks. In operation 610, the patterning process is simulated. The simulation may comprise running any combination of computational models of mask making, lithography, and wafer-etch processes. The result is a prediction of the pattern that would be etched into the wafer for the current mask state of the mask data set In an operation 620, circuit parameters of one or more features of the simulated wafer image are identified for simulation. For example, it may be important for a certain transistor pair to have matching leakage current. In this scenario, the transistor pair is identified for simulation in an operation 630. Other electrical parameters such as, for example, capacitance, saturation current, and inductance of one or more features of the simulated wafer image may be identified for circuit simulation. In an alternative embodiment, operation 620 may also include the identification of geometric variables for use in the simulation operation.

In an operation 630, electrical parameters of one or more circuit features of the simulated wafer image are simulated. For example, in operation 630, circuit parameters modeling tool 135 can target a feature on simulated wafer image and determine the feature's inductance, capacitance, and leakage current through simulation. As mentioned, methods for deriving simulated values for electrical parameters from a simulated wafer image are well known. In one embodiment, circuit parameters modeling tool 135 can be configured to simulate or determine geometric variables such as, for example, variables 415*a-b*, as part of the cost function variables.

In an operation 640, the simulated circuit parameters are analyzed to determine whether the simulated values are within acceptable guidelines. In one embodiment, the simulated geometric variables are also analyzed to determine whether they are acceptable. If the answer in operation 640 is yes, then the optimization of the mask pattern is completed at an operation 650. It is unlikely that a first pass of the mask pattern will yield electrical parameters and geometric variables that are within acceptable guidelines. If the answer is no in operation 640, then the process proceeds to an operation 660.

In operation 660, a cost function comprising the terms in equations 1-5 or equations 1 and 4-7, is minimized with respect to the mask pattern. As mentioned, minimization can be done using a variety of minimization algorithms such as, for example, the Levenberg-Marquardt algorithm, Gauss-Newton algorithm, Quasi-Newton algorithm, simplex-descent method, simulated annealing, genetic algorithm, random search, and grid search. The minimization algorithm updates the adjustable geometric parameters of the mask pattern in a way that reduces the cost function. Once the mask data set is modified, the process is repeated from operations 610-660 until designed values of circuit parameters are reached within an acceptable tolerance, or the minimization algorithm ceases to reduce the cost function significantly, or a predetermined computation time or number of iterations are reached.

Figure 7:
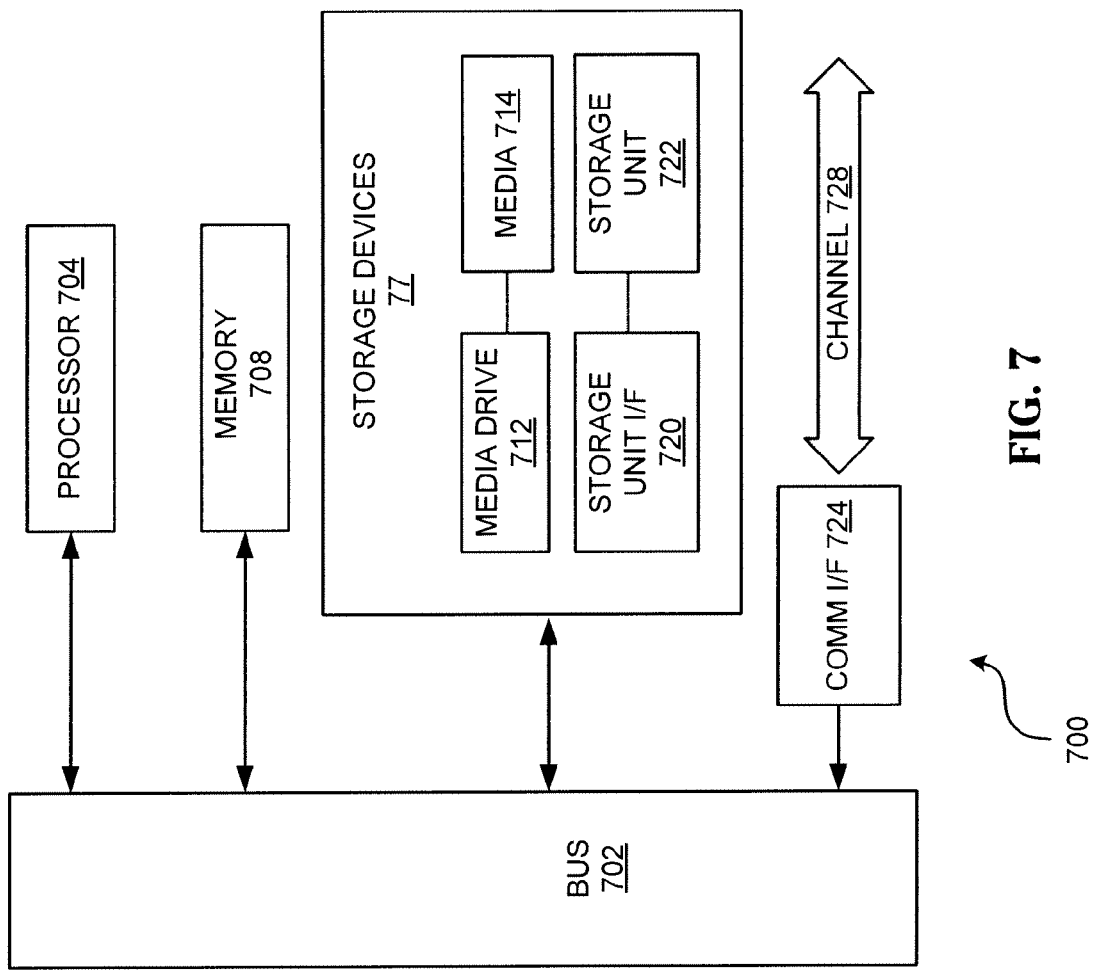
FIG. 7 illustrates an example computer system in which the optical compensation tool can be implemented.

As used herein, the term module might describe a given unit of functionality that can be performed in accordance with one or more embodiments of the present invention. As used herein, a module might be implemented utilizing any form of hardware, software, or a combination thereof. For example, software, firmware, one or more processors, controllers, ASICs, PLAs, logical components or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 7. Various embodiments are described in terms of this example computing module 700. After reading this description, it will become apparent to a person skilled in the relevant art how to implement the invention using other computing modules or architectures.

Referring now to FIG. 7, computing module 700 may represent, for example, computing or processing capabilities found within desktop, laptop and notebook computers; handheld computing devices (PDA's, smart phones, cell phones, palmtops, etc.); mainframes, supercomputers, workstations or servers; or any other type of special or general purpose computing devices as may be desirable or appropriate for a given application or environment. Computing module 700 might also represent computing capabilities embedded within or otherwise available to a given device. For example, a computing module might be found in other electronic devices such as, for example, digital cameras, navigation systems, cellular telephones, modems, routers, WAPs, and any other electronic device that might include some form or processing capabilities.

Computing module 700 might include one or more processors or processing devices, such as a processor 704. Processor 704 might be implemented using a general-purpose or special-purpose processing engine such as, for example, a microprocessor, controller, or other control logic. In the example illustrated in FIG. 7, processor 704 is connected to a bus 702 or other communication medium to facilitate interaction with other components of computing module 700.

Computing module 700 might also include one or more memory modules, referred to as main memory 708. For example, preferably random access memory (RAM) or other dynamic memory, might be used for storing information and instructions to be executed by processor 704. Main memory 708 might also be used for storing temporary variables or other intermediate information during execution of instructions to be executed by processor 704. Computing module 700 might likewise include a read only memory ("ROM") or other static storage device coupled to bus 702 for storing static information and instructions for processor 704.

The computing module 700 might also include one or more various forms of information storage mechanism 710, which might include, for example, a media drive 712 and a storage unit interface 720. The media drive 712 might include a drive or other mechanism to support fixed or removable storage media 714. For example, a hard disk drive, a floppy disk drive, a magnetic tape drive, an optical disk drive, a CD or DVD drive (R or RW), or other removable or fixed media drive. Accordingly, storage media 714, might include, for example, a hard disk, a floppy disk, magnetic tape, optical disk, a CD or DVD, or other fixed or removable medium that is read by, written to or accessed by media drive 712. As these examples illustrate, the storage media 714 can include a computer usable storage medium having stored therein particular computer software or data.

In alternative embodiments, information storage mechanism 710 might include other similar instrumentalities for allowing computer programs or other instructions or data to be loaded into computing module 700. Such instrumentalities might include, for example, a fixed or removable storage unit 722 and an interface 720. Examples of such storage units 722 and interfaces 720 can include a program cartridge and cartridge interface, a removable memory (for example, a flash memory or other removable memory module) and memory slot, a PCMCIA slot and card, and other fixed or removable storage units 722 and interfaces 720 that allow software and data to be transferred from the storage unit 722 to computing module 700.

Computing module 700 might also include a communications interface 724. Communications interface 724 might be used to allow software and data to be transferred between computing module 700 and external devices. Examples of communications interface 724 might include a modem or softmodem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 724 might typically be carried on signals, which can be electronic, electromagnetic, optical or other signals capable of being exchanged by a given communications interface 724. These signals might be provided to communications interface 724 via a channel 728. This channel 728 might carry signals and might be implemented using a wired or wireless medium. Some examples of a channel might include a phone line, a cellular phone link, an RF link, an optical link, a network interface, a local or wide area network, and other wired or wireless communications channels.

In this document, the terms "computer program medium" and "computer usable medium" are used to generally refer to media such as, for example, memory 708, storage unit 720, media 714, and signals on channel 728. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 700 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for optical compensation comprising:
using a computer system to create a simulated circuit pattern using a lithography process, wherein the lithography process uses a photomask defined by a data set having a plurality of polygons that define patterns on the photomask;
calculating a cost function based on an electrical parameter of the simulated circuit pattern, wherein the cost function comprises terms defined by at least one of:
 (a) a sum of squares of normalized differences between simulated and designed values of electrical parameters for a multitude of circuit components,
 (b) an amount by which the simulated value of the electrical parameter exceeds a maximum allowable value, (c) an amount by which the simulated value of the electrical parameter falls below a minimum allowable value, (d) the difference of simulated values of a first and a second electrical parameter of a simulated circuit pattern, (e) a change in the simulated value of the electrical parameter in response to a change in a condition of the lithography process, and (f) a restricted simulated value of the electrical parameter that is not larger than a maximum allowable value or not smaller than a minimum allowable value, and wherein the electrical parameter describes an electrical operational characteristic of the simulated circuit pattern; and adjusting the polygons based on the calculated cost function in order to reduce the value of the cost function.

2. The method of claim 1, wherein adjusting the polygons comprises at least one of: segmenting an edge of a polygon, altering a polygon by moving a segment of its edge, moving a polygon, adding a polygon to the data set, and removing a polygon from the data set.

3. The method of claim 1, wherein the electrical parameter comprises one or more parameters from the group consisting of saturation current, leakage current, threshold voltage, gain, resistance, capacitance, and inductance.

4. The method of claim 1, wherein calculating the cost function further comprises using geometric variables derived from comparing the simulated circuit pattern with a target circuit pattern.

5. The method of claim 1, further comprising adjusting distribution or polarization variables of the illumination in a pupil of an optical projector in a way to reduce the value of the cost function.

6. The method of claim 1, wherein the method is performed using a computer program product having computer readable program code functions embedded in a non-transitory computer useable medium.

7. A computer system configured for optical compensation, comprising:

a processor;

a memory connected to the processor; and a computer-readable medium having instructions embedded therein, the instructions configured to cause the processor to perform the operations of:

creating a simulated circuit pattern using a lithography process, wherein the lithography process uses a photomask defined by a data set having a plurality of polygons that define patterns on the photomask;

calculating a cost function based on an electrical parameter of the simulated circuit pattern, wherein the cost function comprises terms defined by at least one of:

(a) a sum of squares of normalized differences between simulated and designed values of electrical parameters for a multitude of circuit components, (b) an amount by which the simulated value of the electrical parameter exceeds a maximum permissible value, (c) an amount by which the simulated value of the electrical parameter falls below a minimum allowable value, (d) the difference of simulated values of a first and a second electrical parameter of a simulated circuit pattern, (e) a change in the simulated value of the electrical parameter in response to a change in a condition of the lithography process, and (f) a restricted simulated value of the electrical parameter that is not larger than a maximum allowable value or not smaller than a minimum allowable value, and wherein the electrical parameter describes an electrical operational characteristic of the simulated circuit pattern; and adjusting the polygons based on the calculated cost function in order to reduce the value of the cost function.

8. The system of claim 7, wherein adjusting the polygons comprises at least one of: segmenting an edge of a polygon, altering a polygon by moving a segment of its edge, moving a polygon, adding a polygon to the data set, and removing a polygon from the data set.

9. The system of claim 7, wherein the electrical parameter comprises one or more parameters from the group consisting of saturation current, leakage current, threshold voltage, gain, resistance, capacitance, and inductance.

10. The system of claim 7, wherein calculating the cost function further comprises using geometric variables derived from comparing the simulated circuit pattern with a target circuit pattern.

11. The system of claim 7, wherein the instructions are further configured to cause the processor to perform the operation of adjusting distribution or polarization variables of the illumination in a pupil of an optical projector in a way to reduce the value of the cost function.

* * * * *